Perreault et al.

[11] Patent Number: 4,564,575
[45] Date of Patent: Jan. 14, 1986

[54] TAILORING OF NOVOLAK AND DIAZOQUINONE POSITIVE RESISTS BY ACYLATION OF NOVOLAK

[75] Inventors: Stanley E. Perreault; Robert L. Wood, both of Wappingers Falls, N.Y.

[73] Assignee: International Business Machines Corporation, Armonk, N.Y.

[21] Appl. No.: 560,781

[22] Filed: Jan. 30, 1984

[51] Int. Cl.[4] .......................... G03C 1/60; G03C 1/76; G03F 7/26
[52] U.S. Cl. .................................... 430/165; 430/169; 430/189; 430/192; 430/296; 430/326
[58] Field of Search ............... 430/192, 165, 326, 189, 430/168, 169

[56] References Cited

U.S. PATENT DOCUMENTS

| | | | |
|---|---|---|---|
| 3,050,387 | 8/1962 | Neugebauer et al. | 430/192 |
| 3,802,885 | 4/1974 | Lawson et al. | 430/192 |
| 4,089,766 | 5/1978 | Paal et al. | 156/668 |
| 4,197,128 | 4/1980 | Watanabe et al. | 430/156 |
| 4,308,368 | 12/1981 | Kubo et al. | 430/192 |

OTHER PUBLICATIONS

Dinaburg, M. S., "Photosensitive Diazo Cpds.", Focal Press, 1964, pp. 184 and 206.
DeForest, W. S., "Photoresist Materials and Processes", McGraw-Hill Book Co., 1975, pp. 47–59.

Primary Examiner—Charles L. Bowers, Jr.
Attorney, Agent, or Firm—Shirley Church Moore

[57] ABSTRACT

Reduction of the alkaline developer solubility of novolak-diazoquinone positive resists by acylation of phenolic hydroxyl groups of the novolak resin.

39 Claims, 1 Drawing Figure

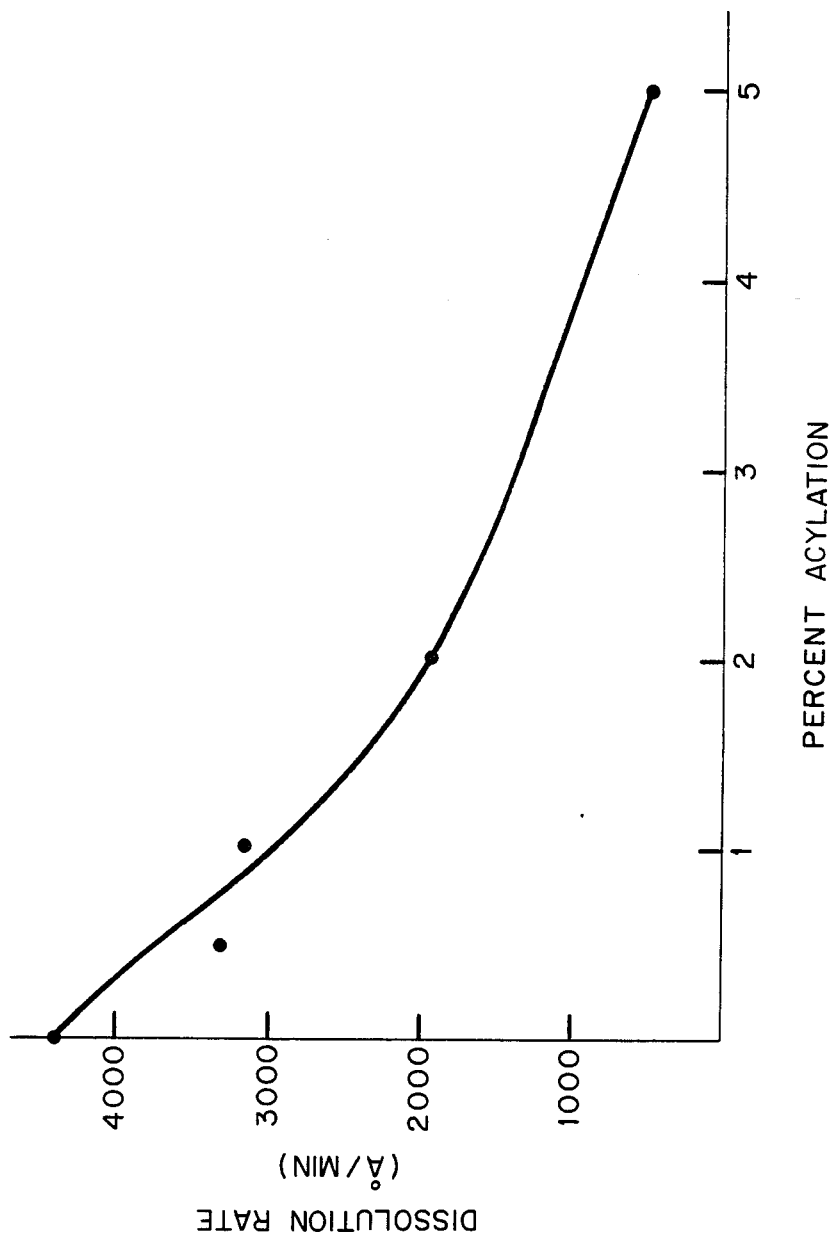

TAILORING OF NOVOLAK AND DIAZOQUINONE POSITIVE RESISTS BY ACYLATION OF NOVOLAK

BACKGROUND OF THE INVENTION

1. Field of the Invention

This invention relates to light-sensitive positive photoresist compositions, and more particularly to radiation-sensitive compositions comprised of an o-naphthoquinone diazide and a phenolic resin or resole having enhanced application among others, to the fabrication of semiconductor photomasks and integrated circuit devices.

2. Description of the Prior Art

A positive photoresist in use today for microlithography applications is comprised of an alkali soluble polymer such as a novolak (e.g. phenol-, cresolformaldehyde, etc.) or resoles and a photoactive component (PAC) such as a diazoquinone, preferably an o-naphthoquinone diazide, as a sensitizer for the resist. Such sensitizers and resists are described among others in U.S. Pat. Nos. 3,046,118, 3,046,121, 3,106,445, 3,201,239 and 3,666,473, which are incorporated herein by reference. When the resist is image-wise exposed to radiation, the exposed areas dissolve in alkaline solution (developer). In this way, image-wise exposure of the photoresist layer is utilized to produce relief patterns of the resist on a substrate for purposes of, for example, making exposure masks or resist patterns such as are employed in the fabrication of integrated circuit devices.

The major portion of the positive type resists are composed of a novolak resin or resole, a diazoquinone component (PAC) and casting solvent(s). The universal application of novolak type polymers to diazoquinone resist systems is based on the aqueous alkaline solubility of these resins. This property is essential to the exploitation of diazo photochemistry, i.e. conversion of non-alkaline soluble compounds to an alkali soluble carboxylic acid by UV radiation. For a given type of diazo PAC there exists an optimum resin to PAC ratio, which provides maximum lithographic performance in a well-defined process. This optimum ratio can seldom be achieved in high-volume resist production facilities because of batch-to-batch variations in resin alkali solubility and/or PAC casting solvent solubility. In general, the main factor dictating PAC to resin ratio in a given resist lot is resin alkali solubility. Each new resist lot is forced to behave like the last lot by adjusting PAC loading, up or down, to compensate for alkali solubility of the particular resin batch being used. PAC solubility places constraints on these adjustments. When resin alkali solubility is relatively high, then PAC loading required for good performance may exceed PAC solubility limits. This problem occurs repeatedly in various and different positive resist lots of this type, and can make several resin lots unuseable for resist applications. In addition, steps often are required to be taken to improve PAC solubility, since even resins with moderate alkali solubility require PAC loading which approaches solubility limits. One approach to improvisng PAC solubility normally employed in the technology involves purity reduction which has a negative impact on resist performance, particularly in E-beam lithography. The overall problem of resin to PAC mismatch is compounded by the inability of providing resins with lower, more desirable alkali solubilities. Table I below shows alkali solubility data for seven lots of novolak resins, with the resins listed in chronological date order of their manufacture. Rate value show how quickly a resin-only film (no PAC) of each lot is solubilized by a dilute alkaline developer. Rate values are relative indicators of PAC loading requirements to make a functional resist.

TABLE I
CRESOL-FORMALDEHYDE NOVOLAK RESIN ALKALI SOLUBILITY

| LOT | DISSOLUTION RATE (Å/MIN) |
|---|---|
| A | 3300 |
| B | 1600 |
| C | 3200 |
| D | 3200 |
| E | 9800 |
| F | 4800 |
| G | 8000 |
| H | 5700 |

The data in the Table indicates a significant trend toward higher alkali solubility with the latter resin lots. Accompanying this trend is the need to load still greater amounts of PAC, which of course has practical limits. The most successful (highest overall resist manufacturerability and performance) is Lot B, which also has the lowest alkali solubility. By contrast, Lots E and G possess the highest alkali solubility but are impractical for resist applications because of PAC solubility limits. Efforts to reproduce Lot B performance in new resin lots have failed because in the complexity of feed-stocks and synthesizing variables associated with this resin. Thus it is difficult to insure a continuing consistent supply of useable resin. Accordingly it would therefore be desirable to devise a technique for reducing novalak alkali solubility without adversely affecting other important resin properties, such as film integrity, gel content, UV transparency, sensitivity, etc.

SUMMARY OF THE INVENTION

A new technique has now been discovered in accordance with this invention for reducing novolak alkali solubility, which relies on modification of preformed polymers or resins. This modification comprises acylation of the phenolic hydroxyl groups of the novalak with an anhydride of an aliphatic monoacid acid containing from 2–5 carbon atoms. This results in the formation, at the phenolic hydroxyl locations, of an acyl group having the structure RCO-, where R is an alkyl group containing from 1 to 4 carbon atoms.

The preparation of the acylated novolak resins may be represented by the following general reaction

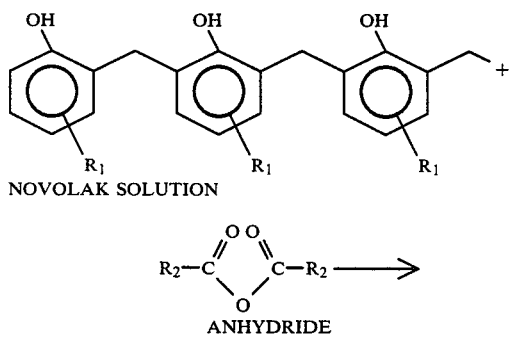

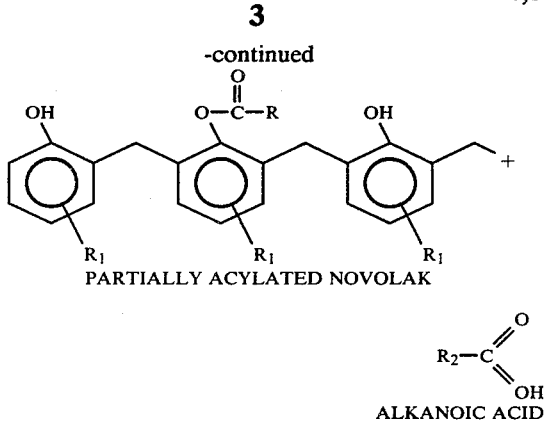

PARTIALLY ACYLATED NOVOLAK

ALKANOIC ACID where $R_1$ is a hydrogen or an alkyl group having 1 to 6 carbon atoms, preferably a methyl group, and $R_2$ is an alkyl group containing from 1 to 4 carbon atoms, and optimally a methyl group.

In a preferred embodiment, the novolak will constitute a cresol-formaldehyde resin having a molecular weight in the range of about 2000 to about 20,000. Conversely, a convenient anhydride for the acylation is acetic acid anhydride, with the reaction continued in solution, until about 1% to about 10%, and more preferably from about 1% to about 5% of the phenolic hydroxyl groups are acylated. As will be appreciatied, the acyl group will have the structure RCO—, where R is a saturated aliphatic group containing from 1 to 4 carbon atoms. Also, the anhydride employed in the acylation can be characterized as an anhydride of an aliphatic monoacid containing from 2 to 5 carbon atoms.

As will be recognized, novolak resins derive their solubility from the acidic nature of phenolic hydroxyl groups, as follows:

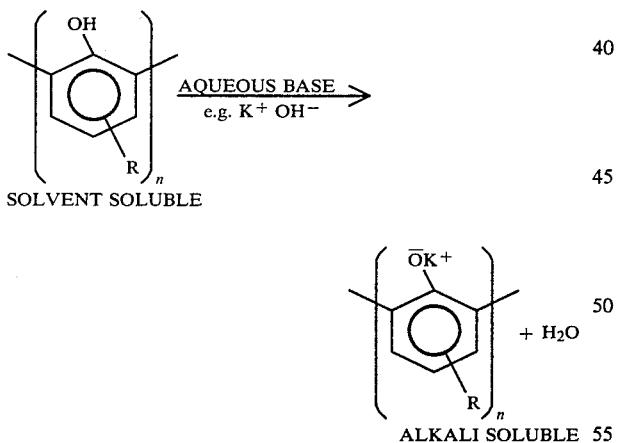

Thus, the alkali solubility of a particular resin is affected by both, the molar concentration of the OH groups as well as their composite acidity. Partial acylation of a resin results in a reduction in the molar concentration of the most highly acidic OH groups within the resin leading to reduced alkali solubility. Acylation of the resin at various levels, therefore provides a means for "tailoring" resin alkali solubility to a desirable range. Acylation at any level always results in a lowering of resin alkali solubility, so a resin cannot be tailored to achieve higher dissolution rates. However, it is important to emphasize that resins possessing lower-than-desirable alkali solubility are extremely rare, and usually exhibit other undesirable properties such as high gel content. Consequently, tailoring by acylation will be effective for the vast majority of resin batches.

It has been further discovered that acylation of the resin can be carried out directly in the resist casting solvent. Such a process is given stepwise below:

1. dissolve resin in casting solvent and normal concentration appropriate with resist type,
2. add predetermined quantity of the acid anhydride,
3. mix solution overnight at 50±5° C.,
4. add the PAC at appropriate concentration, mix to dissolve, filter, and bottle.

Since this process does not require complicated synthesis work-up, e.g. other solvents, catalyst, separations, etc., it can be directly and easily prepared. The overnight reaction period is not an extraordinary measure and it would not impact manufacturing times, since resist formulations normally are held in a reactor several days during adjustment and testing. The only additional work required would involve generation of an engineering curve, plotting resin alkali solubility versus percentage of hydroxyl group acylated. Such a curve could easily be constructed in about two days, as more particularly explained in Example 1 below, with the curve holding for the lifetime of the resin lot (typicaly 6000 pounds).

Accordingly it is an object of this invention to modify positive novolak/diazoquinone resist formulations to provide uniform characteristics therein as may be required for the fabrication of integrated circuit devices.

It is another object of this invention to tailor positive novolak/diazoquinone resist with respect to sensitivity and solubility as may be required for integrated circuit fabrication.

It is another object of this invention to eliminate need for very high molecular weight novolak resins for positive resist formulations which have inherently high gel levels and poor filterability.

It is another object of this invention to modify novolak/diazoquinone resist to permit use of lower molecular weight resins.

A further object of this invention is to provide novolak/diazoquinone positive resists which have consistent and uniform performance in lithographic applications.

It is a further object of this invention to provide for the formulation of novolak/diazoquinone positive resist having improved spectral resist response consistency, where resist extinction versus wavelength profile would not vary from lot-to-lot.

The foregoing and other objects, features and advantages of the invention will be apparent from the following, more particular description of preferred embodiments of the invention as illustrated in the accompanying drawing wherein FIG. 1 is a graph employed for purposes of illustrating a plot of resin dissolution rate versus percentage of hydroxyl acylation for one lot of prepared novolak resin.

Suitable sensitizers for use as photoactive components or the diazoquinones discussed in any of the above noted patents can be used in the present invention. A particularly effective one for purposes of illustrating this invéntion is 2-diazo-1-oxonaphthalene-5-sulfonate diester of (2,4)-dihydroxybenzophenone, referred to herein as PAC-P (e.g. PhotoActive Component-Preferred).

DESCRIPTION OF THE PREFERRED EMBODIMENTS

Having broadly described the invention above, the invention can be better detailed by reference to the development of a curve plotting the resin alkali solubility versus percentage of hydroxyl group acylation. Modification with respect to above indicated Lot F indicated as having a dissolution rate of 4800 Å per min. is described in Example I.

EXAMPLE I

Five samples of resin Lot F having 0%, 0.5%, 1.0%, 2.0% and 5.0% acylation of the phenolic OH groups, based on a resin hydroxide value of 500 milligrams KOH per gram resin, were prepared by dissolving the resin in diglyme at a rate of 3 parts by weight resin, and 7 parts by weight diglyme. Five 50 gram aliquots of this solution containing 0 g, 0.07 g, 0.14 g, 0.28 g, and 0.68 g of reagent grade acetic anhydride were prepared which corresponds to 0%, 0.5%, 1%, 2%, and 5% acylation of the phenolic hydroxyl groups, respectively. All samples were placed on a heated roller at 50° C. overnight. Following filtration through a 1.2 micron silver membrane filter, the samples were spin-coated on 57 millimeter silicon wafers for 30 seconds at 3000 RPM. These wafers had previously been treated with hexamethyldisilazane (HMDS) in Freon vapor to promote adhesion. The coated wafers were baked in an oven at 85° C. for 30 minutes. After measurement of the film thicknesses, the films were individually developed at 25° C. in a solution containing 1 part by volume of Azoplate's AZ-2401 (a KOH developer) developer diluted with 9 parts by volume of deionized water. Dissolution was monitored using a laser end-point detector. The time required to achieve total film dissolution was noted for each wafer. Dissolution times were divided into original film thicknesses to calculate dissolution rate in Angstroms/min. These rates were plotted versus percent acylation in FIG. 1. From the curve of FIG. 1, one may obtain the percent acylation required for any desired dissolution rate up to the maximum 4436 Å per min.

EXAMPLE II

Formulation of Optical Resist with Lot E Resin Acylated to 3%

Lot E novolak resin was chosen for this experiment because its non-acylated alkali solubility is unusably high due to PAC solubility limits. This example is employed to show how acylation can be used to recover an unusable resin.

A 100 g resist sample was prepared by dissolving 28 g of Lot E resin and 64.2 g of diglyme followed by addition of 0.78 g acetic anhydride. After rolling the sample overnight at 50° C., 7 g of the above-indicated PAC-P sensitizer was added and dissolved. The resist was filtered through 1.2 micron and spin coated at 3500 RPM on 57 millimeter silicon wafers pretreated as in Example 1. Control wafers were identically coated with an unacylated-formaldehyde novolak (Resin D from Table I) containing the above indicated PAC-P sensitizer at a thickness of 1 to 2 microns. All wafers were baked in an oven at 85° C. for 30 minutes. The wafers were then exposed in the center using an ultraviolet light exposure tool at doses ranging from 10 to 32 mJ/cm$^2$ in 2 mJ/cm$^2$ increments. Film thicknesses were measured and developed individually in the above indicated Azoplate's AZ-2401 developer at 25° C. Thickness loss in the exposed region was monitored with laser endpoint detect. Time-to-endpoint was recorded for each wafer and divided into original film thicknesses to express develop rate, R in Å min. Log exposure dose vs log develop time curves (not shown) were plotted for each resist. Minimum exposure time (MET) for a five minute develop cycle was interpolated from the curves and corrected to 2.0 micron thickness. These values are shown below:

| SAMPLE | MET (mJ/cm$^2$) |
| --- | --- |
| Lot E @ 3% acylation | 19.7 |
| Control | 17.0 |

This example shows that resin Lot E can be made functional at only 3% acylation. Further fine-tuning of the acylated sample, i.e. reducing PAC content slightly, would provide performance identical to the control resist pepared with unacylated resin D.

For this purpose the control comprised a cresol-formaldehyde resin having a molecular weight of 8000 which was loaded with 17 weight % solid content of 2-diazo-1-oxonaphthalene-5-sulfonate diester of (2,4)-dihydroxybenzophenone (PAC-P) as the photoactive content.

EXAMPLE III

Accelerated Aging of 3% Acylated Novalak/Diazoquinone Resist Lot E

To insure that unreacted acylating agent comprised of acetic anhydride does not produce significant aging effects, the following accelerated aging test was performed:

The resist formulation (Lot E) described in Example II was placed in a 35° C. water bath. Samples were withdrawn after two, four and seven weeks. These times correspond to four, eight and fourteen months of storage at 5° C. (refrigeration), respectively. MET (Minimum Exposure Time) vs unaged control Lot (as described in Example II) was determined for Example II for each aging period. Results are shown in Table II below:

TABLE II

| 35° C. ACCELERATED AGING OF ACYLATED RESIST | | | |
| --- | --- | --- | --- |
| Time (weeks) | 5 Minute MET-Acylated Sample | 5 Minute MET-Unaged Control | Δ% |
| 0 | 19.7 | 17.0 | −16 |
| 2 | 17.8 | 14.4 | −23 |
| 4 | 27.1 | 21.6 | −26 |
| 7 | 26.0 | 24.7 | −5 |

This data reflects only minor variation in resist speed over a projected 14 month period, indicating that residual acylating agent (specifically acetic anhydride) is not present in significant levels.

EXAMPLE IV

Formulation of E-Beam Resist with Lot E Acylated to 5%

Due to greater PAC solubility constraints imposed by E-beam resist, Lot E was acylated to 5% (vs 3% for optical resist). This allowed formulation at "safe" PAC loadings of about 15–17 weight % based on percentage of total solids.

155.8 g of Lot E resin was dissolved in 303 g of diglyme, followed by addition of 7.07 g acetic anhydride. After rolling the bottle of resist overnight at 50° C., a 100 g aliquot was withdrawn and mixed with 6.90 g of 2-diazo-1-oxonaphthalene-5-sulfonate diester of (2,4)-dihydroxybenzophenone (PAC-P). After dissolution and filtration to 1.2 micron, the sample, and the control Lot B were spin-coated to 2-3 micron at 3000 RPM for 40 sec. on silicon wafers pretreated per Example 1. In this example, control Lot B comprised a cresole-formaldehyde novolak of about 6400 molecular weight loaded with the above indicated PAC-P sensitizer. Following a 30 minute, 85° C. prebake (oven) cycle, all wafers received a block exposure at the center of the wafer, at 10 $\mu c/cm^2$. Initial thicknesses were measured, development was performed as in Example II, except developer used was Azoplate's AZ2401 at a ratio of 1 to 3 at 14.5° C. Time-to-endpoint was used to calculated expose dissolution rate (R), or in Angstroms/min. FTA (Film Thickness Analyzer), measurements provided unexposed, develop thicknesses which was used to calculate unexposed dissolution rate $R_o$ (Angstroms/min.). R divided by $R_o$, a measure of contrast, was also calculated. These data are summarized in Table III below:

TABLE III

E-Beam Functional Performance at 5% Acylation

| Sample | $R \pm 1\sigma$ | $R_o \pm 1\sigma$ | $R/R_o$ |
|---|---|---|---|
| 5% Acylated Lot E | 3246 ± 84 | 163 ± 23 | 20.3 |
| Control Lot B | 4239 ± 445 | 246 ± 23 | 17.4 |

These results show that performance equivalent to or better than the control lot can be obtained with a formerly unusable resin. The data also indicates how resist can be tailored to operate in a "safe" PAC loading range.

EXAMPLE V

Tailoring Novalak Resins from Different Lots

To date it has been difficult to utilize novalak resins produced in different manufacturing lots due to their excessive alkali solubilities. This example shows how one novolak resin lot having a molecular weight of about 3000, can be tailored to permit utilization in device fabrication.

Four levels of acylation were prepared by mixing 0.28 g, 0.56 g, 0.98 g, and 1.40 g of acetic anhydride with 50 g aliquots of a solution containing three parts by weight of the novolak resin, and seven parts by weight of diglyme. These additions correspond to 2%, 4%, 7% and 10% acylations, respectively, assuming a resin hydroxide value of 500 mg KOH per gram resin. Alkali solubilities of each sample were measured as in Example I, and are shown in Table IV.

TABLE IV

Acylated Novolak Resin Versus Dissolution Rate

| % Acylation | Dissolution Rate, Å/min. |
|---|---|
| 0 | 11452 |
| 2 | 6047 |
| 4 | 3404 |
| 7 | 0 |
| 10 | 0 |

This resin showed good functional resist performance at about 4–5% acylation.

As is shown in the above Examples, this invention allows a number of significant advantages. First it allows inexpensive tailoring of novolak resins used in the technology. As a result, resists previously considered excessively fast and not usable can now be utilized.

In addition, less photoactive component is needed with acylated resins thus minimizing solubility problems and reducing PAC costs.

Also this invention allows the use of large number of manufacturing Lots some of which would otherwise be incompatable with semiconductor resist processing requirements.

Also the invention eliminates need for very high molecular weight resins which have inherently high gel levels, i.e., poor filterability.

Concurrently this invention allows complete utilization of various lots for resist applications.

The invention also permits use of higher purity PAC's in E-beam resist formulations resulting in better, more consistent, E-beam lithographic performances.

Also, fewer PAC batches would be discarded because of marginal solubility.

In addition the invention allows formulation of optical resist compositions at a constant PAC loading resulting in improved spectral response consistency, e.g. resist extinction versus wavelength profile would not vary from lot-to-lot.

Concurrently the invention allows formation of optical resists at a much lower PAC loading, which would improve resist contrast in the mid-UV by minimizing absorption effects.

While the invention has been particularly shown and described with reference to the preferred embodiments thereof, it will be understood by those skilled in the art that the foregoing and other changes in form and detail may be made therein without departing from the spirit and scope of the invention.

Having thus described my invention, what I claim as new, and desire to secure by Letters Patent is:

1. A positive lithographic resist composition comprised of an admixture of a novolak resin, in sufficient quantity amount when combined with a photoactive component to be developable to form a positive image, and a radiation-sensitive diazoquinone in sufficient amount to function as the photoactive component in an electron bem or optical process, wherein said novolak resin has hydroxyl groups thereof acylated so that an acyl group having the structure RCO— exists in place of the hydrogen at at least a portion of the phenolic hydroxyl locations in order to reduce solubility in alkaline developers, and where R is a saturated aliphatic group containing from 1 to 4 carbon atoms.

2. The resist composition of claim 1 wherein said acyl group is acetyl.

3. The resist composition of claim 2 wherein said novolak is comprised of cresol-formaldehyde.

4. The resist composition of claim 3 wherein from about 1 to about 5% of the phenolic hydroxyl groups, of said novolak, are acylated.

5. The resist composition of claim 1 wherein said novolak is comprised of cresol-formaldehyde.

6. The resist composition of claim 5 wherein about 1 to about 5% of the phenolic hydroxyl groups of said novolak are acylated.

7. The resist composition of claim 1 wherein about 1 to about 5% of the phenolic hydroxyl groups, of said novolak, are acylated.

8. The resist composition of claim 1 wherein said novolak has a molecular weight in the range of about 2000 to about 20000.

9. The resist composition of claim 2 wherein said novolak has a molecular weight in the range of about 2000 to about 20000.

10. The resist composition of claim 3 wherein said novolak has a molecular weight in the range of about 2000 to about 20000.

11. The resist composition of claim 4 wherein said novolak has a molecular weight in the range of about 2000 to about 20000.

12. The resist composition of claim 5 wherein said novolak has a molecular weight in the range of about 2000 to about 20000.

13. The resist composition of claim 6 wherein said novolak has a molecular weight in the range of about 2000 to about 20000.

14. A substrate coated with a layer of a photoresist comprised of an admixture of a novolak resin, in sufficient quantity amount when combined with a photoactive component to be developable to form a positive image, and a radiation-sensitive diazoquinone in sufficient amount to function as the photosensitive component in an electron beam or optical process, wherein said novolak resin has phenolic hydroxyl groups acetylated so that an acyl group having the structure RCO— exists in place of the hydrogen at at least a portion of the phenolic hydroxyl locations in order to reduce solubility in alkaline developers, and where R is a saturated aliphatic group containing from 1 to 4 carbon atoms.

15. The structure of claim 14 wherein said substrate is comprised of semiconductor devices.

16. The structure of claim 15 wherein said devices are comprised of integrated circuits.

17. The structure of claim 16 wherein said acyl group is acetyl.

18. The structure of claim 17 wherein said novolak is comprised of cresol-formaldehyde.

19. The structure of claim 18 wherein said novolak has a molecular wight in the range of about 2000 to about 20000.

20. The structure of claim 19 wherein from about 1 to about 5% of the phenolic hydroxyl groups, of said novolak, are acylated.

21. A method of reducing the dissolution rates of novolak-diazoquinone resists in alkaline solution, comprising:
(a) providing said novolak resin;
(b) acylating the phenolic hydroxyl groups of said novolak resin, so that an acyl group having the structure RCO— exists in place of the hydrogen at at least a portion of the phenolic hydroxyl locations, and where R is an alkyl group containing from 1 to 4 carbon atoms; and
(c) adding said diazoquinone thereto.

22. The method of claim 21 where said hydroxyl groups are acylated with an anhydride of an aliphatic monoacid containing from 2 to 5 carbon atoms.

23. The method of claim 22 wherein said novolak is comprised of a cresol-formaldehyde resin.

24. The method of claim 23 wherein said resin has a molecular weight in the range of about 2000 to about 20000.

25. The method of claim 24 wherein said anhydride comprises acetic anhydride.

26. The method of claim 25 wherein from about 1 to about 5% of the phenolic hydroxyl groups of said novolak are acylated.

27. The method of claim 21 wherein said novolak resin is dissolved in a casting solvent at a concentration appropriate for the resist type prior to the step (b) acylation.

28. The method of claim 27 wherein said phenolic hydroxyl groups are acylated using an anhydride of an aliphatic monoacid containing from 2 to 5 carbon atoms.

29. The method of claim 28 wherein the solution of novolak resin combined with said anhydride of an aliphatic monoacid is mixed at about 50° C. for a period sufficient to effect the desired amount of acylation.

30. The resist composition of claim 3 wherein said diazoquinone is comprised of an o-quinone diazide.

31. The resist composition of claim 30 wherein said o-quinone diazide is comprised of 2-diazo-1-oxonaphtholene-5-sulfonate diester of (2,4)-dihydroxybenzophenone.

32. The resist composition of claim 4 wherein said diazoquinone is comprised of an o-quinone diazide.

33. The resist composition of claim 32 wherein said o-quinone diazide is comprised of 2-diazo-1-oxonaptholene-5-sulfonate diester of (2,4)-dihydroxybenzophenone.

34. The structure of claim 14 wherein said diazoquinone is comprised of an o-quinone diazide.

35. The structure of claim 34 wherein said o-quinone diazide is comprised of 2-diazo-1-oxynaptholone-5-sulfonate diester of (2,4)-dihydroxybenzophenone.

36. The structure of claim 35 wherein said novolak has a molecular weight in the range of about 2000 to about 20000.

37. The structure of claim 36 wherein from about 1 to about 5% of the phenolic hydroxyl groups, of said novolak, are acylated.

38. The method of claim 26 wherin said diazoquinone is comprised of an o-quinone diazide.

39. The method of claim 38 wherein said o-quinone diazide is comprised of a 2-diazo-1-oxonaptholene-5-sulfonate diester of (2,4)-dihydroxybenzophenone.

* * * * *